United States Patent [19]

Kochis et al.

[11] Patent Number: 5,568,357
[45] Date of Patent: Oct. 22, 1996

[54] DISPLAY SUPPORT HAVING CRADLED DAMPING CAPS FOR FLOATING CORE SHOCK ABSORPTION

[75] Inventors: Gary Kochis, Union Town; Neil C. Delaplane, Copley; William R. Rebh, Medina; James M. Cisar, Wadsworth; Yung-Fu Chang, Medina, all of Ohio

[73] Assignee: Metanetics Corporation, Fort Myers, Fla.

[21] Appl. No.: 260,102

[22] Filed: Jun. 15, 1994

[51] Int. Cl.⁶ .................. G06F 1/16; H05K 7/02
[52] U.S. Cl. ........................ 361/681; 359/83
[58] Field of Search ............ 364/708.1; 40/448, 40/159.1, 778; 206/586, 320; 359/83; 248/345.1, 603, 609, 632, 634, 638; 361/681, 685; 312/223.2

[56] References Cited

U.S. PATENT DOCUMENTS

| | | | |
|---|---|---|---|
| 5,192,143 | 3/1993 | Lajara et al. | 403/24 |
| 5,363,227 | 11/1994 | Ichikawa et al. | 359/83 |
| 5,394,306 | 2/1995 | Koenck et al. | 248/613 X |
| 5,419,626 | 5/1995 | Crockett | 312/223.2 X |
| 5,479,285 | 12/1995 | Barke | 359/83 |

*Primary Examiner*—Michael W. Phillips
*Attorney, Agent, or Firm*—Kenneth P. Robinson

[57] ABSTRACT

Impacts to the case of a portable electronic unit including a display are dissipated by a plurality of thermoplastic elastomeric damping elements which isolate an internal frame unit, carrying the display and associated electronic components, from contact with the enclosure. Each damping element is provided with corresponding positioning structures within the case to ensure that the frame unit "floats" on protective shock absorbing material to provide three-dimensional support and damping of impacts incident from any direction. Damping elements may take the form of small caps of elastomeric material at spaced positions around the periphery of the frame unit. Electronic connections to the display screen are accomplished using flexible connectors to maintain the mechanical isolation of the display screen from the rest of the unit.

7 Claims, 3 Drawing Sheets

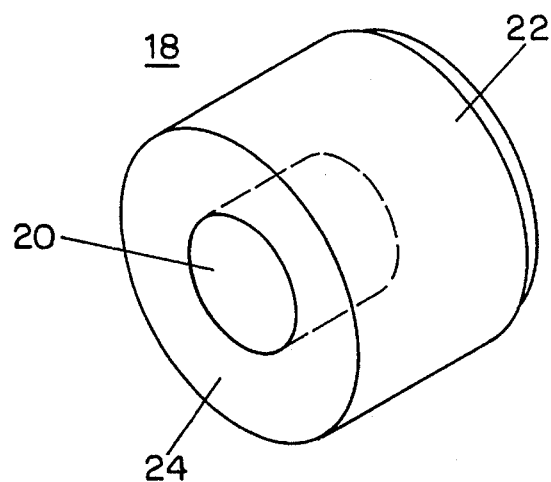
FIG. 2
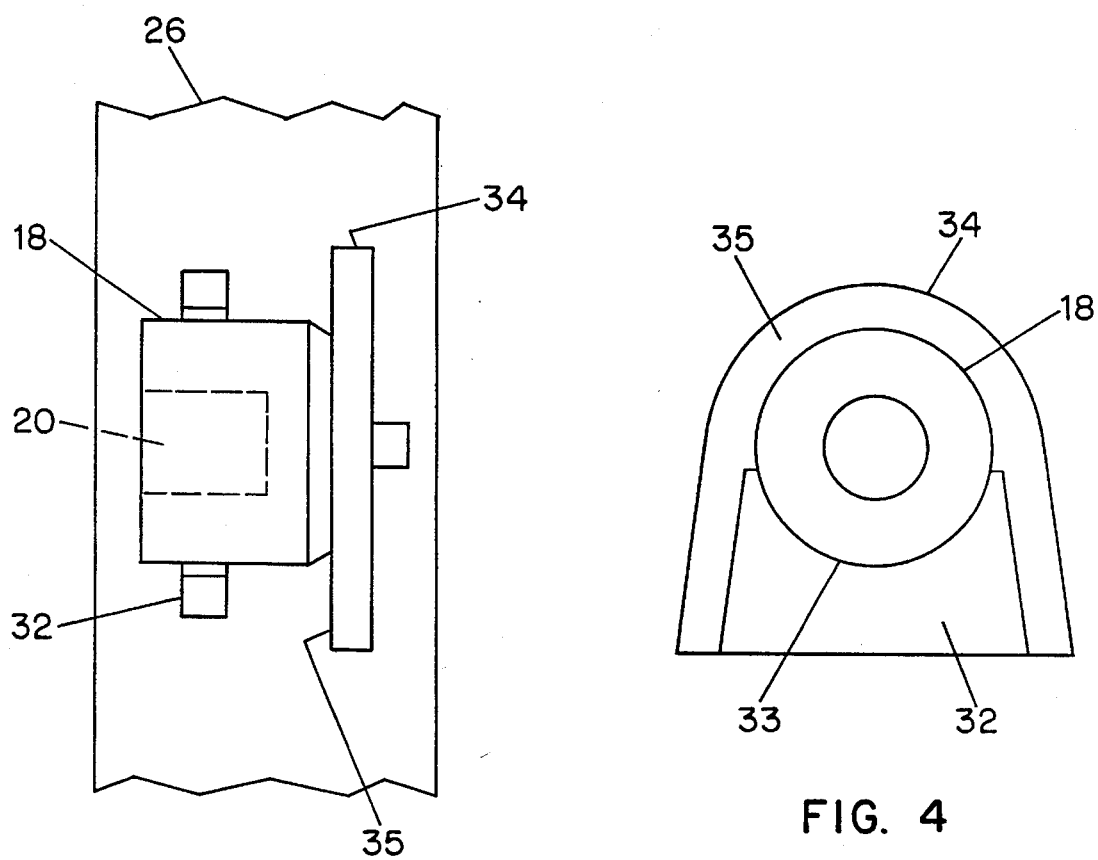
FIG. 3
FIG. 4

DISPLAY SUPPORT HAVING CRADLED DAMPING CAPS FOR FLOATING CORE SHOCK ABSORPTION

The invention relates to shock absorbing protection for portable electronic units.

BACKGROUND OF THE INVENTION

Increased computing capacity and speed made possible by new powerful microprocessors has resulted in a plethora of portable electronic devices, such as hand-held video games, laptop computers, and pen-based computers. Pen-based computers are now used in a variety of situations ranging from inventory record keeping to patient assessment in hospitals. The primary output device and, in the case of pen-based systems, for input as well, is the screen display. Touch panels of pen-based systems and displays of notebook computers which are glass are quite fragile, and can be severely damaged when the device is dropped from a relatively short distance, even from a height of less than three feet. Further, the electronic components themselves may also be subject to damage from mechanical shock. The fragile nature of these display screens and associated electronics may limit the use of portable electronic devices in environments where a high degree of durability and ruggedness is required.

Such devices are customarily protected by enclosing the components in an impact resistant plastic case. A typical case used to enclose a pen-based computer is composed of one or more high-impact plastics, such as polycarbonate and ABS. This type of case is strong enough to withstand a drop onto a non-yielding surface. However, while the plastic case may survive, the resulting impact forces transferred to internal components can be severe enough to damage internal electronic components, such as disc drives and display portions. A glass screen, particularly of a larger size included in a pen-based computer or portable work slate unit, is particularly susceptible to damage in this manner.

While devices could be fitted with an external armor to absorb mechanical shock or impact, surrounding the device with such impact resistant armor inherently increases the size and weight of the unit and thus negates much of the advantages of portability. Various other forms of shock protection such as gaskets, springs and rubber mounts are used in other applications for purposes of shock or vibration isolation. However, such prior arrangements are typically inadequate for present purposes for one or more of the following reasons. Three-dimensional protection is not provided so as to be responsive to impacts incident in any possible direction; one or two-dimensional protection may be provided. The mounting arrangement is not sufficiently robust to maintain positional integrity of components following a drop from a significant height onto a concrete surface. Only vibration isolation may be provided, without significant shock absorption on substantial impact. Springs or other compound type materials may be employed which do not possess shock damping or absorption properties. Such inadequacies have resulted in the absence of a suitable solution applicable to drop protection of portable electronic units, particularly those including displays of significant size.

It is therefore an object of the present invention to provide shock resistant portable electronic units characterized by one or more of the following:

The display and associated electronics of the unit are supported by an internal frame unit mechanically isolated from a shock resistant enclosure.

The display and associated electronics of the unit are three-dimensionally cushioned by resilient damping material.

The unit includes a shock damping configuration robust enough to maintain component positional integrity after the unit is dropped with any direction of impact.

The unit includes a shock damping configuration which is inexpensive and readily assembled.

The shock damping configuration provides a three-dimensional multi-point damping system utilizing thermoplastic elastomers for shock damping cushioning.

SUMMARY OF THE INVENTION

In accordance with the invention, a shock resistant portable electronic unit includes a three-dimensional enclosure of shock resistant material having upper and lower sections configured to be fastened together. The unit also includes a display portion and a frame unit having peripheral dimensions proportioned to fit within the enclosure without physical contact therewith and adapted to support the display portion. Shock absorbing means formed of resilient damping material are positioned between peripheral portions of the frame unit and contact areas of the enclosure and arranged to:

support the frame unit within the enclosure so as to prevent dislocation of the frame unit by drop shock forces incident upon the enclosure from any direction, and provide three-dimensional cushioning between the frame unit and the enclosure effective to dampen transmittal to the frame unit of drop shock forces incident upon the enclosure from any direction.

In a particular embodiment of the invention, the frame unit includes a plurality of projections extending outward from the peripheral portions, each projection having an end and a cross-sectional geometry, and the shock absorbing means includes a plurality of damping caps each having an end, a cross-sectional geometry and an opening extending partially through the damping cap and configured to accept insertion of one of the projections. In addition, the first section of the enclosure includes a plurality of first cradle supports each having a contact area corresponding to a first portion of the cross-sectional geometry of one of the mounting caps. The second section includes a plurality of second cradle supports each having a contact area corresponding to a second portion of the cross-sectional geometry of one of the mounting caps. The second section also includes a plurality of lateral supports each positionable adjacent to an end of one of the mounting caps.

For a better understanding of the invention, together with other and further objects, reference is made to the accompanying drawings and the scope of the invention will be pointed out in the accompanying claims.

BRIEF DESCRIPTION OF THE DRAWINGS

FIG. 2 is a detailed view of a damping cap.

FIG. 3 is a detailed bottom view of a cradle support and lateral support assembly in the upper housing.

FIG. 4 is a side view of the FIG. 3 assembly.

DETAILED DESCRIPTION OF THE INVENTION

Figure 1:
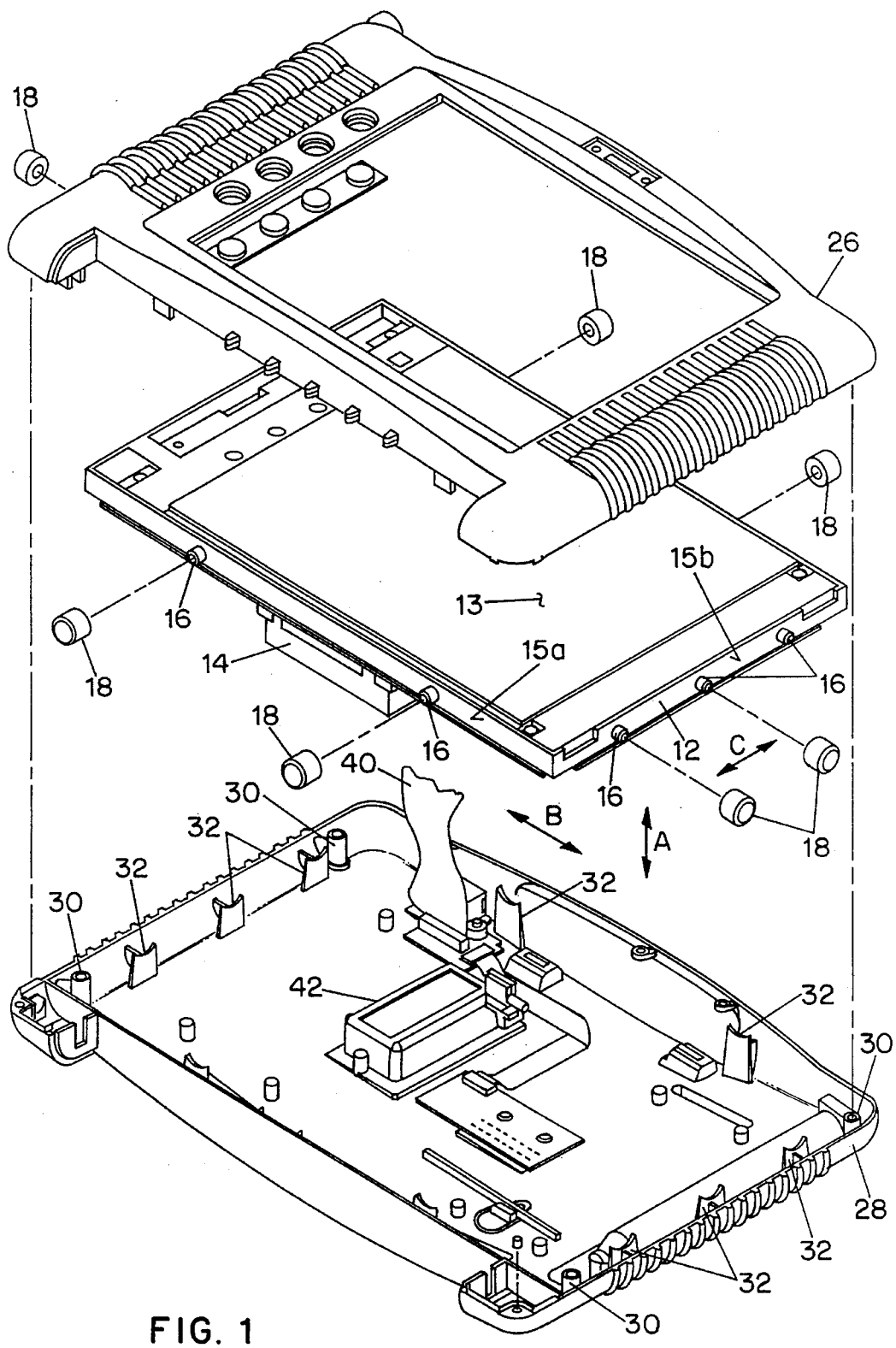
FIG. 1 is an exploded view of one embodiment of a shock resistant portable electronic unit in accordance with the invention.

One embodiment of a shock resistant portable electronic unit, in the form of a work slate unit utilizing the invention, is illustrated in FIG. 1. As shown, the work slate includes a frame unit 12 adapted to support a large display portion 13 and associated electronic components 14, partially visible behind the display. With display and electronic portions 13 and 14 removed, frame unit 12 may typically have the form of a generally rectangular structural frame having rail type longer side portions 15a and shorter end portions 15b. Frame unit 12 is suitably configured for support of the majority of all display and electronic portions of the work slate unit in this example, and may include additional structural elements connected to or between side and end portions 15a and 15b behind the display portion 13. Frame unit 12 also includes projections 16 configured for cooperation with shock absorbing means 18, as will be further described.

The FIG. 1 unit also includes a three-dimensional enclosure of shock resistant material, shown as comprising an upper section 26 having a large central opening and a lower section 28, which is enclosed except for various access openings. An important aspect of the FIG. 1 unit is that the peripheral dimensions of the frame unit 12 are proportioned to fit within the assembled enclosure 24, 26 without physical contact between frame unit 12 and the enclosure.

Referring now to FIG. 2, there is illustrated shock absorbing means in the form of damping cap 18. As shown, cap 18 has the shape of a cylindrical section having a circular cross-sectional geometry with a circular opening 20 extending partially through the damping cap, so that opening 20 stops before reaching the far end of cap 18 which is not visible in FIG. 2. As indicated with reference to the dotted outline of opening 20, cap 18 has an end wall thickness at 22 and a side wall thickness at 24 which can be specified by skilled persons on the basis of computation or empirical data in view of the weights and dimensions involved and the properties of the material of which the damping caps are formed in particular applications. Caps 18 are desirably formed of material having shock absorbing or damping properties. Examples of elastomeric materials with damping properties which have been found effective are "SANTOPRENE" which is produced by Monsanto Company of St. Louis, Mo. and "SORBOTHANE" which is produced by Sorbothane, Inc. of Kent, Ohio. Other materials having suitable properties may also be used.

FIGS. 3 and 4 show details of a cradle support and lateral support assembly such as incorporated into the structure of the upper enclosure section 26 of FIG. 1. FIG. 3 is a bottom view looking up into section 26 with a damping cap 18 superimposed in working relationship and FIG. 4 is a side view. In FIG. 4, upper vertical positioning means is shown as cradle support 32 having a contact area 33 whose side profile is an arc of a circle dimensioned to correspond to the circular cross-sectional geometry of damping cap 18, in this example. Lateral positioning means is shown as lateral support 34 structurally supported by enclosure section 26 outward from cradle support 32. Lateral support 34 is configured to provide a contact area 35 for contact with the closed end of cap 18. With reference to FIG. 1, it will be seen that cradle supports 32 are also positioned at locations spaced around the internal periphery of bottom section 28, however, bottom section 28 does not include any associated lateral supports 34.

During assembly of the FIG. 1 unit, a damping cap 18 is placed in position on each of the projections 16 existing at spaced positions on peripheral portions of frame unit 12. Frame unit 12 is then positioned partially within upper section 26 so that each damping cap 18 rests on the contact area 33 of an upper cradle support 32, with the closed end of cap 18 positioned contiguously to the contact area 35 of a lateral support 34. Then, when lower section 28 is assembled to upper section 26, the contact areas 33 of the lower cradle supports 32 of lower section 28 are positioned contiguously to a lower portion of the circular cross-sectional geometry of the damping caps 18. Sections 26 and 28 are then fastened together. With this configuration, it will be seen that the shock absorbing means, in the form of the set of ten damping caps (three per end and two per side in this example), are positioned between peripheral portions of the frame unit 12 and the contact areas of the enclosure 26, 28, so that there is no physical contact between the frame unit and the enclosure. With the resilient damping properties of the damping caps 18, this arrangement is thus effective to both:

- support the frame unit 12 (and the display and electronic components mounted thereon) within the enclosure 26, 28, so as to prevent dislocation of the frame unit by drop shock forces incident upon the enclosure from any direction, and
- provide three-dimensional cushioning between the frame unit 12 and the enclosure 26, 28 effective to dampen transmittal to the frame unit of drop shock forces incident upon the enclosure 26, 28 from any direction.

For present purposes, "drop shock forces" are defined as forces resulting from dropping the assembled unit onto a concrete floor or other surface from a distance. Obviously, there may be finite protectional limits for any practical implementation, so that dropping a unit out of a window or from other excessive height may result in destruction of the enclosure and the entire unit as a practical matter. However, the objective here is to provide improved protection for drops from reasonable heights, as well as from other shocks and impact type forces. It will be seen that the combination of the damping caps 18, the projections 16 and positioning means 32, 34 provides support while additionally providing cushioning upon the occurrence of an impact upon the enclosure from above, below, left, right, at either end, or from any other direction, i.e., three-dimensional cushioning, as indicated by arrows A, B and C in FIG. 1, which is effective to dampen drop shock forces incident from any direction. Also, it will be appreciated that since the damping caps are positioned so that some of the caps will always be placed into compression regardless of the direction of impact upon the enclosure, prevention of dislocation of the frame unit and resistance to flexing or twisting forces are enhanced by not being dependent upon shearing or cross-tearing qualities of the damping caps. With the combination of a structural frame and shock absorbing elements as described, an arrangement which has true three-dimensional support and damping characteristics is thereby provided.

With respect to specific details of the FIG. 1 embodiment, in this example display 13 is rigidly attached to frame unit 12 using fastening techniques well known in the art. Associated electronics 14 may also be rigidly attached to frame unit 12, again using techniques well known in the art such as screws, bolts, or epoxy. Along the peripheral edges 15a and 15b of assembly 12 a series of projections 16 may be formed during a molding process or may be added separately as by insertion of pins into holes, again using known fastening techniques. By sizing opening 20 appropriately relative to the diameter of projection 16, a mechanical frictional fit may be sufficient to hold each cap 18 place until screen assembly 12 is positioned within the unit. Alternatively, each cap 18 may be glued to projection 16 using suitable adhesives. Frame unit 12 is then sandwiched between upper section 26 and lower section 28, in essence, enabling screen assembly 12 to "float" on caps 18. Upper section 26 is connected to lower section 28 by screws or bolts through stanchions 30 to form a case for the device. However, other attachment methods for connecting upper section 26 to lower section 28 may be substituted.

The number and spacing of the projections 16, and thereby the multi-point support and damping via caps 18, is adapted to the physical sizes and masses involved, as well as the properties of the particular material of which the damping caps 18 are formed. Each projection 16 is typically cylindrical in shape and has a circular or other cross-sectional geometry (e.g., hexagonal or octagonal). In a particular implementation, each damping cap 18 had an outside diameter of about one-half of an inch, an internal hole diameter of somewhat smaller than one-quarter of an inch, and a length of about three-eights of an inch. The damping caps are constructed of a thermoplastic elastomer or other material providing the desired shock absorption and dissipation properties; vibration transmission, performance at temperature extremes and other properties may also be taken into account in the choice of materials. Examples of types of appropriate material are given above.

Figure 5:
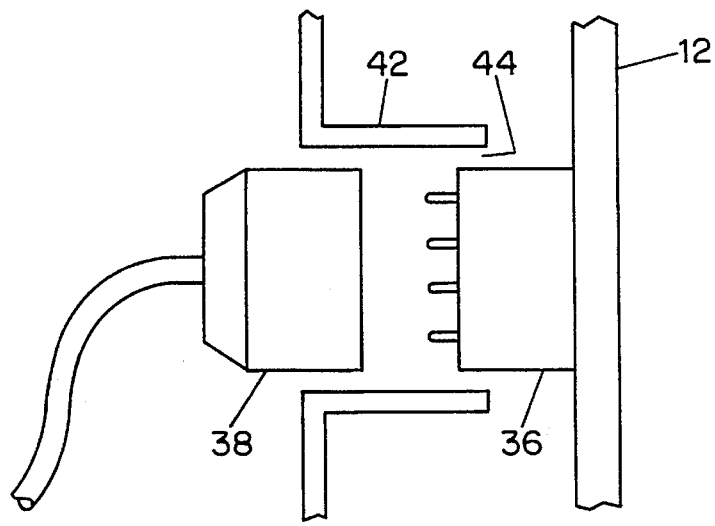
FIG. 5 shows a flexible electrical conductor arrangement.

As represented in FIG. 1, flexible electrical conductors illustrated as parallel conductor ribbon cable 40 may be physically attached to both the lower enclosure section 28 and electronic components mounted on frame unit 12. Alternatively, as shown in simplified form in FIG. 5, frame unit 12 may carry an outwardly extending electrical connector assembly 36 arranged to extend through an opening in the lower portion 42 of lower portion 28, for coupling to a connector 38 mounted on flexible cable 40. As shown, an opening 44 may be provided so that even with connector assembly 36 coupled to an external cable, the frame unit 12 is still mechanically isolated from the enclosure with respect to impacts or mechanical shocks that are experienced by the enclosure 26, 28. With an arrangement such as shown in FIG. 5, it may also be desirable to provide a form of flexible sealing member between connector assembly 36 and the edges of opening 44 in order to seal out dirt and moisture.

Figure 6:
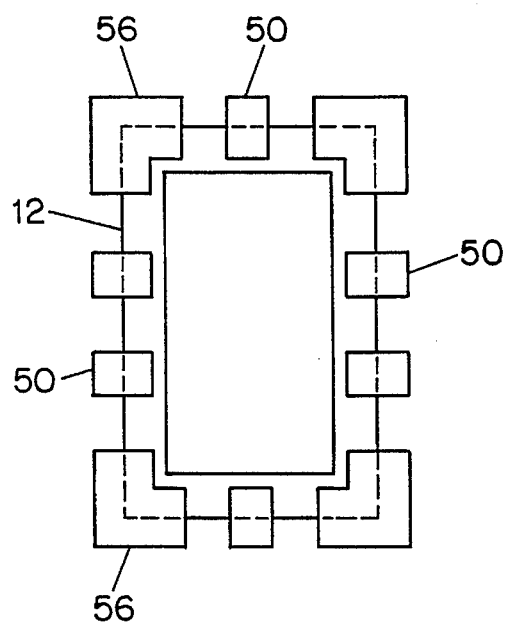
FIGS. 6 and 7 illustrate an alternative embodiment in accordance with the invention.
Figure 7:
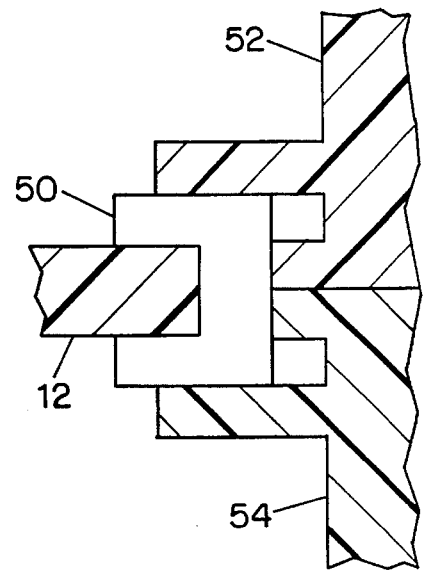

An alternative embodiment is illustrated in FIGS. 6 and 7. FIG. 6 includes a simplified representation of frame unit 12 upon which shock absorbing means in the form of a plurality of damping element sections 50 having a generally U-shaped cross-sectional geometry have been placed to encompass a peripheral portion of frame unit 12. FIG. 6 and other figures are not necessarily to scale, certain dimensions having been enlarged for greater clarity. FIG. 7 provides an end view of a damping element section 50, which may be formed of material having shock damping and dissipation properties as already discussed with reference to damping caps 18. In FIG. 7 damping element section 50 is shown encompassing a peripheral portion of frame 12 of simplified cross-sectional profile. Portions 52 and 54 of modified forms of upper and lower enclosure sections, respectively, are also shown in FIG. 7. As illustrated, enclosure portions 52 and 54 each include positioning means providing contact areas to support the frame unit via three-dimensional contact with the damping element sections 50 spaced around the periphery of frame unit 12 as shown in FIG. 6. Functioning of sections 50 is basically as described with reference to damping caps 18. Damping element sections 50 may also be provided in the modified form of corner configuration 56 and groups of sections 50 and sections 56 may be used separately, or intermixed as show, in different applications of the invention. Alternatively, a single damping element section may be formed in one piece to encompass the entire periphery of frame unit 12.

While there have been described what are at present considered to be the preferred embodiments of this invention, it will be obvious to those skilled in the art that various changes and modifications may be made therein without departing from the invention and it is, therefore, aimed to cover all such changes and modifications as fall within the scope of the invention.

What is claimed is:

1. A shock resistant portable electronic unit, comprising:

a three-dimensional enclosure of shock resistant material, including at least two separable sections;

a frame unit having peripheral dimensions proportioned to fit within said enclosure without physical contact therewith and adapted to support at least one electronic component, said frame unit including a plurality of projections extending outward from said peripheral portions, each said projection having an end and a cross-sectional geometry; and shock absorbing means comprising resilient damping material located along peripheral portions of said frame unit and positioned between contact areas of two separable sections of said enclosure and arranged to support said frame unit within said enclosure so as to prevent dislocation of said frame unit by drop shock forces incident upon said enclosure from any direction, and provide three-dimensional cushioning between said frame unit and said enclosure effective to dampen transmittal to said frame unit of drop shock forces incident upon said enclosure from any direction, said shock absorbing means comprising a plurality of damping caps each having an end, a cross-sectional geometry and an opening extending partially through said damping cap and configured to accept insertion of one of said projections; and wherein said enclosure comprises cooperating first and second sections, said first section including a plurality of first cradle supports each having a contact area corresponding to a first portion of the cross-sectional geometry of one of said mounting caps, said second section including a plurality of second cradle supports each having a contact area corresponding to a second portion of the cross-sectional geometry of one of said mounting caps, and said second section also including a plurality of lateral supports each positionable adjacent to an end of one of said mounting caps.

2. A shock resistant portable electronic unit, comprising:

a three-dimensional enclosure including upper and lower structurally fastenable sections;

a display portion;

a frame unit having peripheral dimensions proportioned to fit within said enclosure without physical contact therewith and adapted to support said display portion, said frame unit including a plurality of projections extending outward from peripheral portions of said frame unit;

shock absorbing means comprising a plurality of damping caps supported by said projections and configured to provide three-dimensional cushioning of said projections;

said enclosure further including upper vertical positioning means within said upper section configured to provide contact areas for said damping caps to limit upward motion of said frame unit, lower vertical positioning means within said lower section configured to provide contact areas for said damping caps to limit downward motion of said frame unit, and lateral positioning means within at least one of said upper and lower sections configured to provide contact areas for said damping caps to limit motion of said frame unit in a lateral direction.

3. A shock resistant portable electronic unit as in claim 2, wherein said upper and lower vertical positioning means are additionally configured to provide contact areas partially encompassing said damping caps to limit motion of said frame unit along a third axis normal to both of said vertical and lateral directions.

4. A shock resistant portable electronic unit as in claim 2, wherein each of said damping caps has an end, a cross-sectional geometry and an opening extending partially through said damping cap, and is configured to accept insertion of one of said projections.

5. A shock resistant portable electronic unit as in claim 4, wherein said upper vertical positioning means includes a plurality of upper cradle supports each having a damping cap support area corresponding to a first portion of the cross-sectional geometry of one of said mounting caps, and said lower vertical positioning means includes a plurality of lower cradle supports each having a damping cap support area corresponding to a second portion of the cross-sectional geometry of one of said mounting caps.

6. A shock resistant portable electronic unit as in claim 5, wherein said upper and lower cradle supports are configured to at least partially encompass said cross-sectional geometry of said mounting caps to limit motion of said frame unit along a third axis normal to both of said vertical and lateral directions.

7. A shock resistant portable electronic unit as in claim 2, wherein said electronic unit is a portable electronic work slate unit including a touch-responsive display screen having a glass portion.

* * * * *